(12) United States Patent
Manabe

(10) Patent No.: US 8,921,178 B2
(45) Date of Patent: Dec. 30, 2014

(54) SEMICONDUCTOR DEVICES WITH SELF-ALIGNED SOURCE DRAIN CONTACTS AND METHODS FOR MAKING THE SAME

(71) Applicant: Renesas Electronics Corporation, Kanagawa (JP)

(72) Inventor: Kenzo Manabe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/860,813

(22) Filed: Apr. 11, 2013

(65) Prior Publication Data
US 2013/0307082 A1 Nov. 21, 2013

Related U.S. Application Data

(60) Provisional application No. 61/647,806, filed on May 16, 2012.

(51) Int. Cl.
| | |
|---|---|
| *H01L 21/8238* | (2006.01) |
| *H01L 21/336* | (2006.01) |
| *H01L 29/49* | (2006.01) |
| *H01L 29/423* | (2006.01) |
| *H01L 29/40* | (2006.01) |
| *H01L 29/66* | (2006.01) |
| *H01L 29/78* | (2006.01) |
| *H01L 29/51* | (2006.01) |
| *H01L 21/8234* | (2006.01) |

(52) U.S. Cl.
CPC ...... *H01L 29/42372* (2013.01); *H01L 29/4966* (2013.01); *H01L 29/401* (2013.01); *H01L 21/823814* (2013.01); *H01L 29/66545* (2013.01); *H01L 29/51* (2013.01); *H01L 21/823425* (2013.01); *H01L 21/823842* (2013.01); *H01L 29/78* (2013.01)
USPC ............................ 438/230; 438/299; 438/308

(58) Field of Classification Search
CPC ............... H01L 21/823412; H01L 21/823828; H01L 21/823437; H01L 21/823807
USPC ........... 438/230, 299, 308; 257/364, 412, 413
See application file for complete search history.

(56) References Cited

U.S. PATENT DOCUMENTS

| | | | | |
|---|---|---|---|---|
| 6,080,646 | A | * | 6/2000 | Wang ............................ 438/585 |
| 6,083,836 | A | * | 7/2000 | Rodder ......................... 438/690 |
| 2007/0238320 | A1 | * | 10/2007 | Bhattacharyya et al. ...... 438/786 |
| 2008/0054330 | A1 | * | 3/2008 | Forbes et al. ................. 257/310 |
| 2008/0308877 | A1 | * | 12/2008 | Kinoshita et al. ............. 257/369 |
| 2009/0011562 | A1 | * | 1/2009 | Licitra et al. .................. 438/283 |
| 2011/0062501 | A1 | * | 3/2011 | Soss et al. ..................... 257/288 |
| 2013/0260548 | A1 | * | 10/2013 | Park ............................... 438/592 |

* cited by examiner

*Primary Examiner* — Kevin Parendo
(74) *Attorney, Agent, or Firm* — Young & Thompson

(57) ABSTRACT

Improved formation of replacement metal gate transistors is obtained by utilizing a silicon to metal substitution reaction. After removing the dummy gate, a gate dielectric and work function metal are deposited. The work function metal is deposited to a different thickness for the P-channel transistors than for the N-channel transistors. A sacrificial polysilicon gate is then formed, which is caused to undergo substitution with a metal such as aluminum.

22 Claims, 4 Drawing Sheets

SEMICONDUCTOR DEVICES WITH SELF-ALIGNED SOURCE DRAIN CONTACTS AND METHODS FOR MAKING THE SAME

BACKGROUND

The invention relates to replacement metal gate transistors and methods for making the same.

Replacement metal gate transistors are made by removing a dummy gate of polysilicon from the transistor by etching to expose a gate trench. The gate trench is then filled with the metal that will constitute the gate in the finished device. Replacement metal gate (RMG) processes facilitate making the high-k gate dielectric/metal gate transistors needed for sub-50 nm MOSFET devices.

However, when a metal gate material is deposited into the gate trench from which the dummy poly-Si gate has been removed by etching, it can be difficult to fill the trench completely so that voids are not present. Additional process steps are conventionally used, such as "wetting" the gate trench with PVD titanium, followed by "seeding" the wetted trench with a thin CVD aluminum layer, and then at last filling the trench with aluminum by a reflow PVD technique. However these techniques can still result in insufficient gap-fill characteristics, as well to a resistivity increase due to alloying and a decrease in adhesion.

The conventional techniques for RMG formation therefore require additional process steps which are still not fully effective in eliminating voids between the replacement metal gate and the gate trench. Process time, device yield and device reliability are consequently adversely affected.

SUMMARY

The present inventors have discovered that replacement metal gate transistors with improved gap-fill of the replacement metal gates can be achieved at low cost and without a loss of resistivity by utilizing a silicon-metal substitution reaction to form the replacement metal gate. Furthermore, the substitution of metal for silicon can be promoted by the use of a titanium capture layer. Still further, the barrier conductive layer that is deposited prior to forming the sacrificial polysilicon gate is deposited to a different thickness in the N-channel regions than in the P-channel regions, and acts as a stopper layer during the silicon-metal substitution reaction as well as a tunable work function metal to achieve different gate threshold voltages in the finished devices.

Thus, the present invention in one aspect relates to a semiconductor device comprising a semiconductor substrate and an N-channel transistor and a P-channel transistor formed on the semiconductor substrate. Each of the N-channel transistor and the P-channel transistor has a gate dielectric film overlying the substrate, and a gate electrode overlying the gate dielectric film. The gate electrode comprises a metal substituted layer and a barrier conductive layer located between the gate dielectric film and the metal substituted layer. The barrier conductive layer of the N-channel transistor has a different thickness than the barrier conductive layer of the N-channel transistor.

In preferred embodiments of the semiconductor device according to the present invention, the barrier conductive layer contains nitrogen.

In preferred embodiments of the semiconductor device according to the present invention, the metal substituted layer has a silicon content from 0.1 to 10 atomic %.

In preferred embodiments of the semiconductor device according to the present invention, the metal substituted layer comprises at least one metal selected from the group consisting of Al, Cu, Ag, Pt and W.

In preferred embodiments of the semiconductor device according to the present invention, each of the N-channel transistor and the P-channel transistor has a gate length of 20 nm or less.

In preferred embodiments of the semiconductor device according to the present invention, each of the N-channel transistor and the P-channel transistor has a gate length of 10-20 nm.

In preferred embodiments of the semiconductor device according to the present invention, each of the N-channel transistor and the P-channel transistor has a gate height of 60 nm or less.

In preferred embodiments of the semiconductor device according to the present invention, each of the N-channel transistor and the P-channel transistor has a gate height of 40-60 nm.

In preferred embodiments of the semiconductor device according to the present invention, the protective dielectric layer comprises silicon nitride.

In preferred embodiments of the semiconductor device according to the present invention, the protective dielectric layer provides stress for a channel region of the transistor.

In another aspect, the present invention relates to a method of making a semiconductor device, comprising forming a dielectric layer over dummy gate electrodes overlying a semiconductor substrate having an N-channel region and a P-channel region, exposing an upper surface of the dummy gate electrodes and removing the dummy gate electrodes thereby forming trenches. Next there is formed a gate dielectric layer, a barrier conductive layer and a silicon layer in the trenches. The thickness of the barrier conductive layer in trenches overlying the N-channel region is different from the thickness of the barrier conductive layer in trenches overlying the P-channel region. A first metal is then deposited on the silicon layer, the first metal being capable of undergoing a substitution reaction with silicon. The first metal is then annealed so as to effect a substitution of the first metal for the silicon layer, followed by removal of a silicon-containing layer that is formed overlying the first metal by the substitution.

In preferred embodiments of the method according to the present invention, a layer of a second metal is formed on the first metal deposited by the depositing step, prior to performing the annealing step, the second metal being capable of forming a silicide.

In preferred embodiments of the method according to the present invention, the second metal is titanium.

In preferred embodiments of the method according to the present invention, the dummy gate electrodes are positioned between respective pairs of sidewalls, and wherein the trenches are formed between respective pairs of the sidewalls.

In preferred embodiments of the method according to the present invention, the silicon layer is etched such that an upper surface of the silicon layer is recessed from upper surfaces of the sidewalls, prior to depositing the metal on the silicon layer.

In preferred embodiments of the method according to the present invention, the barrier conductive layer is a nitrogen-containing film.

In preferred embodiments of the method according to the present invention, the annealing is conducted at a temperature of 400° C. to 500° C.

In preferred embodiments of the method according to the present invention, the first metal has a silicon content of 0.1 to 10 atomic % following the annealing.

In preferred embodiments of the method according to the present invention, the first metal is at least one of Al, Cu, Ag, Pt and W.

In preferred embodiments of the method according to the present invention, the sidewalls are spaced from one another by a length of 20 nm or less.

In preferred embodiments of the method according to the present invention, the sidewalls are spaced from one another by a length of 10-20 nm.

In preferred embodiments of the method according to the present invention, the trenches have a depth of 60 nm or less.

In preferred embodiments of the method according to the present invention, the trenches have a depth of 40-60 nm or less.

BRIEF DESCRIPTION OF THE DRAWINGS

The invention will be more fully understood from the following detailed description of various non-limiting examples thereof, taken with reference to the accompanying drawings, in which.

DETAILED DESCRIPTION

Figure 1:
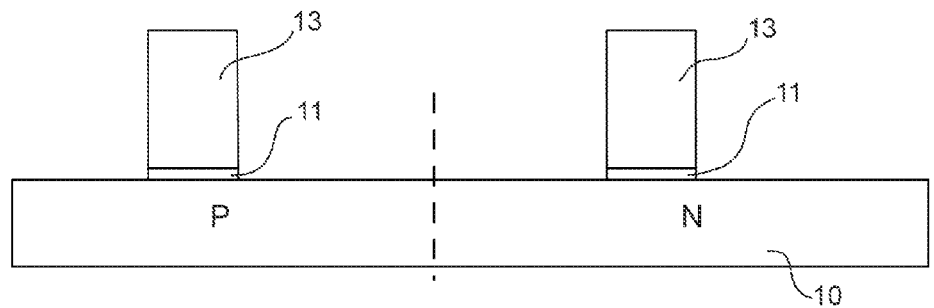
FIG. 1 shows a first stage of processing of a semiconductor device according to an embodiment of the present invention, as well as of a method according to an embodiment of the present invention.
Figure 2:
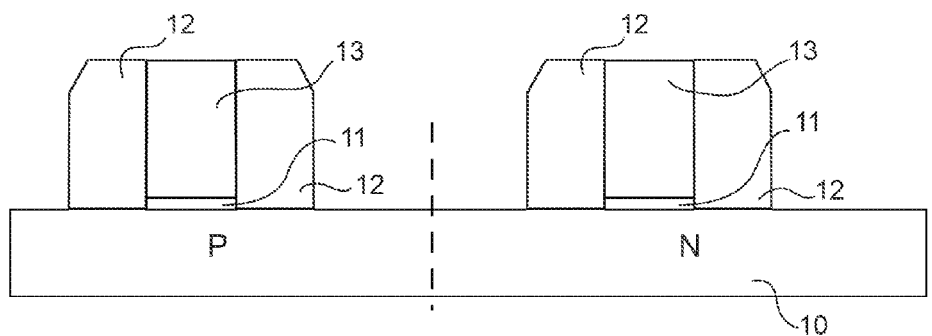
FIG. 2 shows a subsequent stage of processing of a semiconductor device according to an embodiment of the present invention, as well as of a method according to an embodiment of the present invention.

In FIG. 1, a dummy gate dielectric layer 11 and dummy gate electrodes 13 have been formed over semiconductor substrate 10 having a P-channel region and an N-channel region. Next, as shown in FIG. 2, a pair of sidewall spacers 12 is formed on the substrate 10, at the both sides of the dummy gate electrode.

Figure 3:
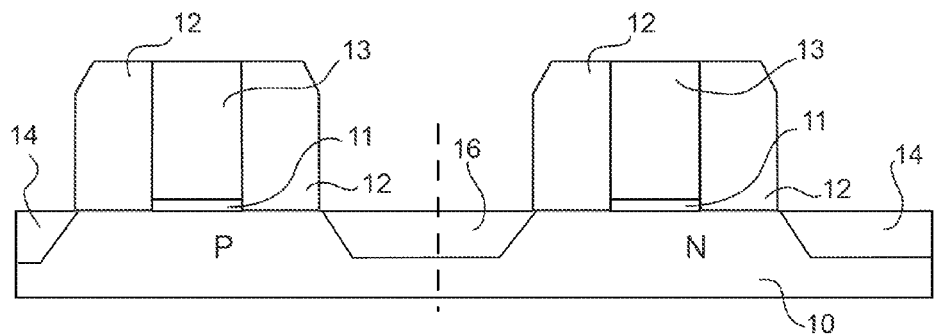
FIG. 3 shows a subsequent stage of processing of a semiconductor device according to an embodiment of the present invention, as well as of a method according to an embodiment of the present invention.

Sidewall spacers 12 may be formed of materials known for that purpose, for example, silicon nitride. Source 14 and drain 16 regions are then formed in substrate 10 by diffusion, as shown in FIG. 3. Although in this embodiment the source and drain regions 14, 16 are recessed within substrate 10 they may in other embodiments of the invention be elevated in relation to substrate 10.

Figure 4:
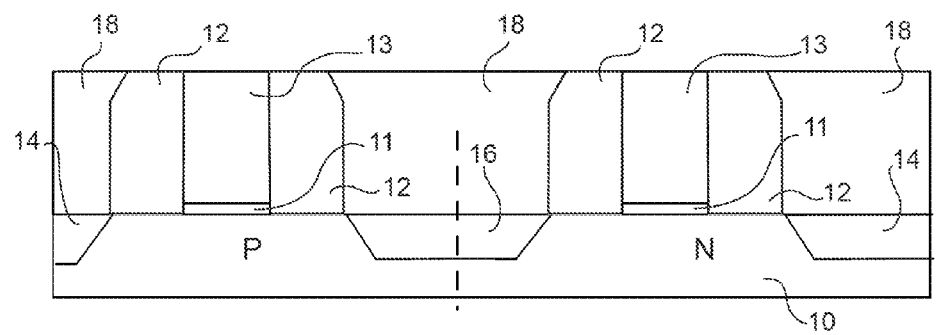
FIG. 4 shows a subsequent stage of processing of a semiconductor device according to an embodiment of the present invention, as well as of a method according to an embodiment of the present invention.
Figure 5:
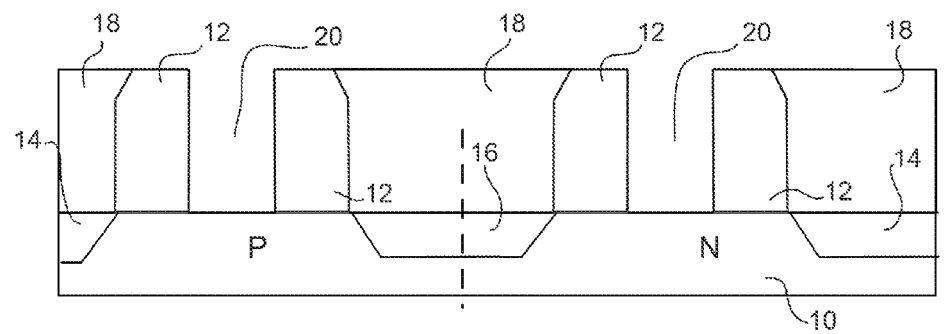
FIG. 5 shows a subsequent stage of processing of a semiconductor device according to an embodiment of the present invention, as well as of a method according to an embodiment of the present invention.

A dielectric layer 18, for example of silicon dioxide, is then formed over the dummy gate electrodes 13, side walls 12, and source and drain regions 14, 16. An upper surface of the dummy gate electrode is then exposed through dielectric layer 18, as shown in FIG. 4, and the dummy gate electrode and dummy gate dielectric layer were removed so as to form trench 20 between side walls 12, as shown in FIG. 5. As is known to those skilled in this art, trench 20 is typically elongated in the direction perpendicular to the plane of the page in FIG. 5, and the gate that will be formed in that trench may serve plural transistors arrayed along the trench.

Figure 6:
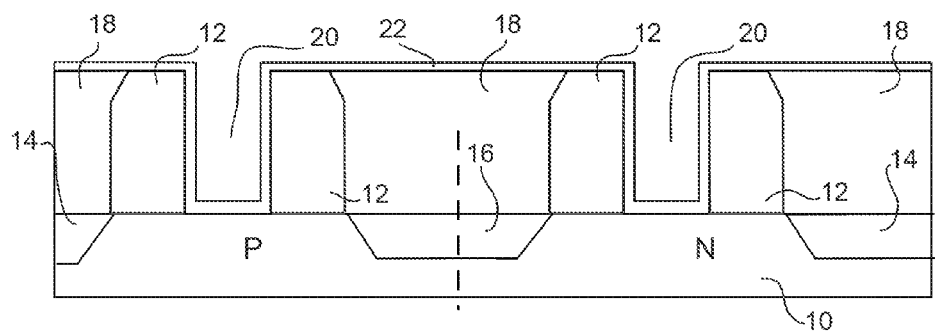
FIG. 6 shows a subsequent stage of processing of a semiconductor device according to an embodiment of the present invention, as well as of a method according to an embodiment of the present invention.

As shown in FIG. 6, a gate dielectric layer 22 is then formed, which covers the trenches 20, which is to say the inner surfaces of side walls 12 and the surfaces of substrate 10 exposed between the side walls 12. Gate dielectric layer 22 as formed also covers the dielectric film 18. Gate dielectric layer 22 is preferably a high-k (HK) material that is suitable for current and future generation device dimensions. Examples of suitable high-k gate dielectrics are hafnium-based gate dielectrics, including hafnium silicate materials and dielectrics composed of layers of materials having different chemical compositions. Gate dielectric layer 22 is preferably deposited by atomic layer deposition (ALD) to a thickness in the range of 0.1 to 10 nm.

Figure 7:
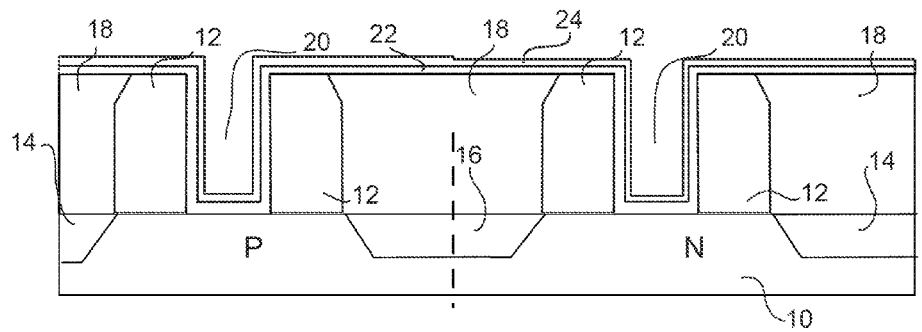
FIG. 7 shows a subsequent stage of processing of a semiconductor device according to an embodiment of the present invention, as well as of a method according to an embodiment of the present invention.

Next, as shown in FIG. 7, a barrier conductive layer 24 is formed on the gate dielectric layer 22. Barrier conductive layer 24 is preferably a work function metal such as titanium nitride (TiN). Barrier conductive layer 24 acts as a stopper during the metal-silicon substitution reaction that will be described hereinafter. Barrier conductive layer also permits adjusting the threshold voltage of the transistor. In particular, the barrier conductive layer 24 has a different thickness in the N-channel region of substrate 10 than it does in the P-channel region, and in this case a greater thickness for the PMOS devices than for the NMOS devices. This permits the different threshold voltages that are necessary for PMOS and NMOS devices to be achieved solely by varying the thickness of the barrier conductive layer, without necessarily varying its composition.

Barrier conductive layer 24 may be formed for example by chemical vapor deposition (CVD) or by atomic layer deposition (ALD), and is preferably formed to a thickness in the range from 0.1 to 10 nm.

Figure 8:
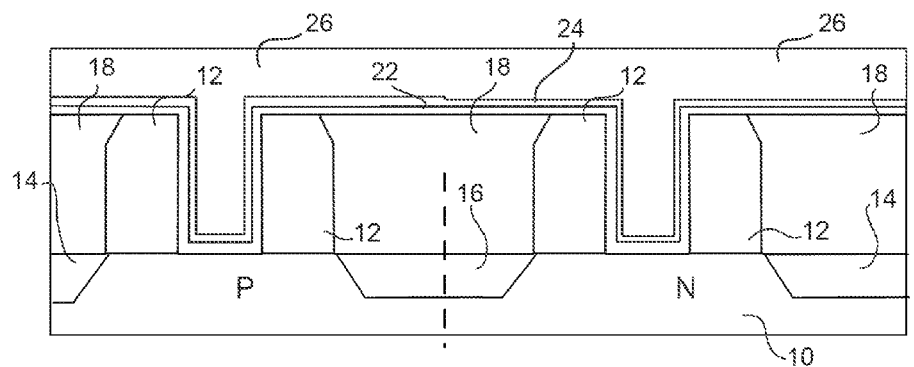
FIG. 8 shows a subsequent stage of processing of a semiconductor device according to an embodiment of the present invention, as well as of a method according to an embodiment of the present invention.
Figure 9:
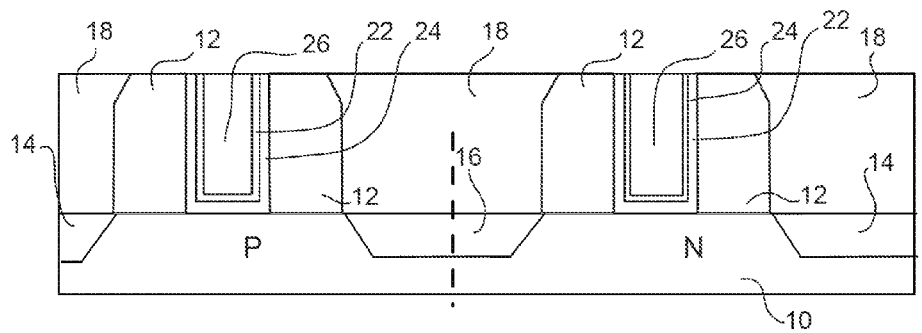
FIG. 9 shows a subsequent stage of processing of a semiconductor device according to an embodiment of the present invention, as well as of a method according to an embodiment of the present invention.

Next, as shown in FIG. 8, trenches 20 are filled with polysilicon 26, for example deposited by CVD, and excess polysilicon 26 along with the excess of layers 22 and 24 are removed from dielectric layer 18 and from the upper surfaces of sidewalls 12, for example by chemical mechanical polishing (CMP). Thus, polysilicon layer 26 and layers 22 and 24 remain only within the trenches 20 that have now been filled by those layers, as shown in FIG. 9.

The polysilicon 26 filling trenches 20 thus serves as a further dummy gate, or sacrificial gate, for the metal-silicon substitution reaction to be described below. Polysilicon has significantly better step coverage and gap fill characteristics than metals such as aluminum; therefore, these sacrificial polysilicon gates 26 are less prone to occurrence of voids than conventional replacement metal gates. Moreover, even if a void should occur in a sacrificial polysilicon gate 26, it will normally be filled by metal in the subsequent silicon-metal substitution reaction described below.

At this point, the upper part of polysilicon layer 26 may be partially removed, such that the remaining polysilicon is recessed relative to sidewalls 12 and layers 22 and 24 that remain covering the inner surfaces of those sidewalls, if it is desired to form a recessed metal gate. This optional partial removal of polysilicon 26 is preferably performed by reactive ion etching (RIE). As those skilled the art are aware, polysilicon is relatively easy to remove by RIE, in contrast to, for example, aluminum, and this is another significant benefit of the devices and methods according to preferred embodiments of the present invention.

Figure 10:
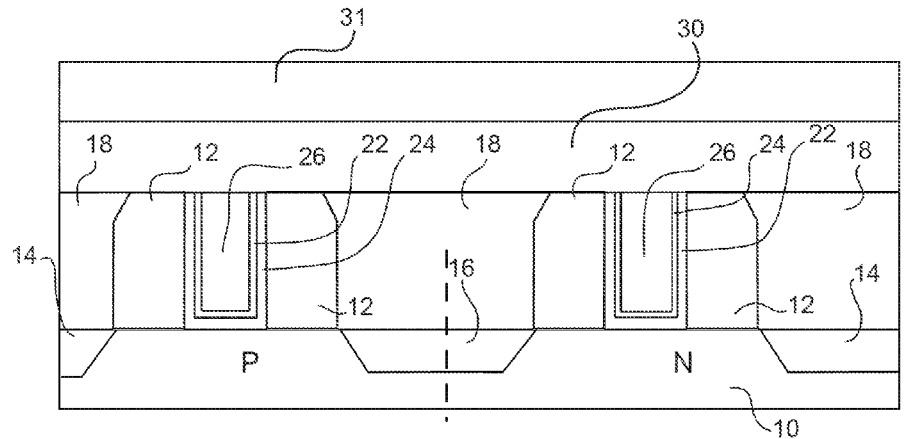
FIG. 10 shows a subsequent stage of processing of a semiconductor device according to an embodiment of the present invention, as well as of a method according to an embodiment of the present invention.
Figure 11:
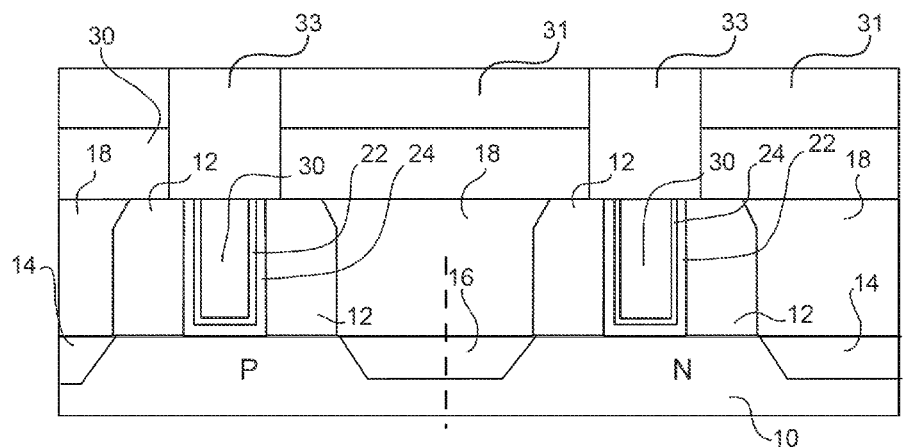
FIG. 11 shows a subsequent stage of processing of a semiconductor device according to an embodiment of the present invention, as well as of a method according to an embodiment of the present invention.

Next, as shown in FIG. 10, a layer of a first metal 30 is deposited for example by sputtering or CVD so as to cover the sacrificial polysilicon gates 26, as well as the exposed regions of layers 22 and 24, dielectric layer 18, and sidewalls 12. First metal 30 is a metal that is capable of undergoing a substitution reaction with silicon, especially polysilicon, under the influence of heat. Examples of such materials include aluminum, copper, silver, platinum and tungsten. Mixtures of such metals may also be used. Aluminum is most preferred among such metals at present.

A layer of a second metal 31 is then formed on the first metal layer 30 in this embodiment, although this step is optional. The second metal is one which forms a silicide with the polysilicon 26 during the substitution reaction. Examples of the second metal are titanium, cobalt and nickel, with titanium being preferred. The benefit of using a layer of the second metal is that it acts as a capture layer that promotes the substitution of the first metal 30 for the polysilicon 26, and thereby permits operating at lower process temperature and/or shorter process duration. Therefore, production of RMG transistors can be achieved with even shorter turnaround time and at even lower cost.

The structure depicted in FIG. 10 is then subjected to annealing at a temperature in the range of 400° C. to 500° C., and more preferably 400° C. to 450° C. Such annealing causes the aluminum 30 above the gates and polysilicon 26 to undergo a substitution reaction as is described for example by Fukuda et. al., "A New Aluminum Pattern Formation Using Substitution Reaction of Aluminum for Polysilicon and Its Application to MOS Device Fabrication," *IEEE Trans. Electr. Dev.*, vol. ED-31, no. 6, pp. 828-832 (June 1984).

As the polysilicon 26 migrates upwardly to the level of the layer of first metal 30, it is captured by and reacts with the second metal 31 to form a silicide 33, in this case titanium silicide.

The replacement of polysilicon by aluminum and vice-versa will be nearly complete in such a substitution reaction; however, a small residual quantity of silicon will remain in the now underlying aluminum layer, and may serve as a forensic indicator of the substitution reaction having been performed. In particular, the metal layer 30 after it is relocated by the substitution reaction preferably has a silicon concentration in a range from 0.1 to 10 atomic %.

Figure 12:
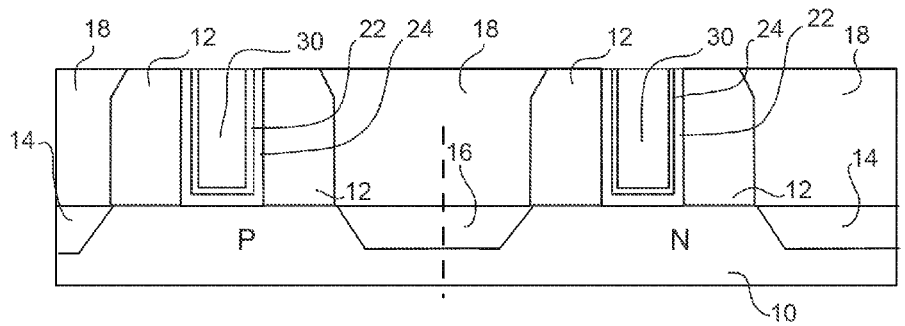
FIG. 12 shows a device according to an embodiment of the present invention.

As shown in FIG. 12, the residual layers 30, 31 and the silicide regions 33 are then removed, to form the final transistor structure, which may then proceed to a process of contact formation.

As discussed above, the embodiments and examples discussed herein are non-limiting, and various constitutions other than those described above can also be adopted.

For example, amorphous silicon may be used instead of polysilicon. Amorphous silicon is advantageous for certain applications as it can be formed at lower temperatures than polysilicon, which can provide better gap fill characteristics and/or prevent possible variations in the threshold voltage of the transistors.

It is furthermore apparent that the present invention may be variously modified without departing from the scope and spirit of the present invention as set forth in the accompanying claims.

What is claimed is:

1. A method of making a semiconductor device, comprising:
   forming a dielectric layer over dummy gate electrodes overlying a semiconductor substrate having an N-channel region and a P-channel region;
   exposing an upper surface of said dummy gate electrodes;
   removing said dummy gate electrodes thereby forming trenches;
   forming a gate dielectric layer, a barrier conductive layer and a silicon layer in said trenches, wherein a thickness of said barrier conductive layer in trenches overlying said N-channel region is different from a thickness of said barrier conductive layer in trenches overlying said P-channel region;
   depositing a first metal on said silicon layer, said first metal being capable of undergoing a substitution reaction with silicon; and
   annealing said first metal so as to effect a substitution of said first metal for said silicon layer and removing a silicon-containing layer that is formed overlying said first metal by said substitution, said substitution of said first metal for said silicon layer forming a metal substituted layer.

2. The method according to claim 1, further comprising forming a layer of a second metal on said first metal deposited by said depositing step, prior to performing said annealing step, said second metal being capable of forming a silicide.

3. The method according to claim 2, wherein said second metal is titanium.

4. The method according to claim 1, wherein said dummy gate electrodes are positioned between respective pairs of sidewalls, and wherein said trenches are formed between respective pairs of said sidewalls.

5. The method according to claim 4, further comprising etching said silicon layer such that an upper surface of said silicon layer is recessed from upper surfaces of said sidewalls, prior to depositing said metal on said silicon layer.

6. The method according to claim 4, wherein said sidewalls are spaced from one another by a length of 20 nm or less.

7. The method according to claim 6, wherein said sidewalls are spaced from one another by the length of 10-20 nm.

8. The method according to claim 6, wherein said trenches have a depth of 60 nm or less.

9. The method according to claim 8, wherein said trenches have trenches have the depth of 40-60 nm.

10. The method according to claim 1, said barrier conductive layer is a nitrogen-containing film.

11. The method according to claim 1, wherein said annealing is conducted at a temperature of 400° C. to 500° C.

12. The method according to claim 1, wherein said first metal has a silicon content of 0.1 to 10 atomic % following said annealing.

13. The method according to claim 1, wherein said first metal is at least one of Al, Cu, Ag, Pt and W.

14. The method of claim 1, wherein said semiconductor device, after said annealing step, comprises:
    said semiconductor substrate, said N-channel transistor and said P-channel transistor formed on said semiconductor substrate, with each of said N-channel transistor and said P-channel transistor having the gate dielectric film overlying said substrate, and with said gate electrode overlying said gate dielectric film, said gate electrode comprising said metal substituted layer,
    said barrier conductive layer is located between said gate dielectric film and said metal substituted layer, and
    said barrier conductive layer of said N-channel transistor has a different thickness than said barrier conductive layer of said N-channel transistor.

15. The method of claim 14, wherein said metal substituted layer has a silicon content from 0.1 to 10 atomic % following said annealing.

16. The method of claim 15, wherein said metal substituted layer comprises at least one metal selected from the group consisting of Al, Cu, Ag, Pt and W.

17. The method of claim 14, wherein each of said N-channel transistor and said P-channel transistor has a gate length of 20 nm or less.

18. The method of claim 17, wherein each of said N-channel transistor and said P-channel transistor has the gate length of 10-20 nm.

19. The method of claim 17, wherein each of said N-channel transistor and said P-channel transistor has a gate height of 60 nm or less.

20. The method of claim 19, wherein each of said N-channel transistor and said P-channel transistor has the gate height of 40-60 nm.

21. The method of claim 20, wherein said protective dielectric layer provides stress for a channel region of said transistor.

22. The method of claim 14, wherein said dielectric layer comprises silicon nitride.

* * * * *